United States Patent
Clemow et al.

(10) Patent No.: US 8,645,444 B2
(45) Date of Patent: Feb. 4, 2014

(54) IIR FILTER FOR REDUCING THE COMPLEXITY OF MULTIPLYING ELEMENTS

(75) Inventors: Richard David Clemow, Gerrards Cross (GB); Anthony James Magrath, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 567 days.

(21) Appl. No.: 12/745,726

(22) PCT Filed: Dec. 12, 2008

(86) PCT No.: PCT/GB2008/051183
§ 371 (c)(1),
(2), (4) Date: Aug. 18, 2010

(87) PCT Pub. No.: WO2009/081188
PCT Pub. Date: Jul. 2, 2009

(65) Prior Publication Data
US 2010/0306297 A1    Dec. 2, 2010

(30) Foreign Application Priority Data
Dec. 21, 2007   (GB) .................................. 0725116.8

(51) Int. Cl.
*G06F 17/10*    (2006.01)
(52) U.S. Cl.
USPC .......................................... 708/300; 708/301

(58) Field of Classification Search
None
See application file for complete search history.

(56) References Cited

U.S. PATENT DOCUMENTS

| | | | |
|---|---|---|---|
| 4,255,794 A | 3/1981 | Nakayama | |
| 5,170,369 A | 12/1992 | Rossum | |
| 5,487,023 A * | 1/1996 | Seckora | 708/316 |
| 5,629,881 A | 5/1997 | Leeb et al. | |
| 5,717,726 A | 2/1998 | Herrmann et al. | |

FOREIGN PATENT DOCUMENTS

EP    0 948 133 A2    10/1999

* cited by examiner

*Primary Examiner* — Michael D Yaary
(74) *Attorney, Agent, or Firm* — Dickstein Shapiro LLP

(57) ABSTRACT

An infinite impulse response (IIR) filter is provided for receiving an input signal and outputting a filtered signal. The filter comprises feedback circuitry for feeding back said filtered signal, the feedback circuitry comprising a first delay element for delaying said filtered signal; and a sub-unit, for receiving said delayed filtered signal, for outputting a summed signal which is the difference between said delayed filtered signal and a further-delayed filtered signal, and for outputting a multiplied signal which is an inverted further-delayed filtered signal multiplied by a first filter coefficient. At least said input signal, said delayed filtered signal, said multiplied signal, and said summed signal are employed to generate said filtered signal.

8 Claims, 9 Drawing Sheets

IIR FILTER FOR REDUCING THE COMPLEXITY OF MULTIPLYING ELEMENTS

The present invention relates to IIR filters, and in particular to a method and an architecture for reducing the complexity of multiplying elements in such filters.

BACKGROUND

The Infinite Impulse Response (IIR) digital filter is well known and widely documented. For a given filter specification, it is known that the sample rate has a significant influence on the required numerical accuracy of the implementation, both in terms of the accuracy of the filter coefficients, and in terms of the precision of the multipliers and adders: the higher the sample rate, the more accuracy is required to maintain the same filter performance. This increases the burden on hardware and software implementations, in turn increasing cost.

In some applications, the signals are intentionally highly over-sampled, meaning that the ratio of the sample rate to highest signal frequency component is high. Although this may at first seem to be inefficient, this does allow a reduction in the number of bits used to represent the signal, and this is often the reason for using over-sampling. For example, it is sometimes appropriate to use only one bit to represent the signal at the over-sampled rate. Thus, there are applications where there are good reasons for an over-sampling situation to exist, and in which it is required to implement an IIR filter. One such example is an ambient noise cancellation system.

There are several standard implementations of the IIR filter, for example the so-called "Direct Form I" and "Direct Form II" types. It is also common to split a higher-order filter into parallel or cascaded second-order sections, or a combination thereof, and there has been much research over the years on the best way to make this subdivision, taking into account stability, fixed-point issues, numerical ranges, and so on. However, all of these architectures suffer from the same numerical accuracy issues when the signals are over-sampled.

The present invention is a method of implementing over-sampled IIR filters without requiring such high numerical accuracy. This leads to a lower cost solution, whether implemented in hardware or software.

Furthermore, it has been found that the feed-forward coefficients of an over-sampled filter are also sensitive to numerical accuracy, and no prior-art method for reducing the computations requirements for this part of the filter has been found. The present invention also includes a method to address this part of the filter.

SUMMARY OF INVENTION

According to a first aspect of the invention, there is provided an infinite impulse response (IIR) filter for receiving an input signal and outputting a filtered signal, said IIR filter comprising: feedback circuitry for feeding back said filtered signal, said feedback circuitry comprising: a first delay element for delaying said filtered signal; and a sub-unit, for receiving said delayed filtered signal, for outputting a summed signal which is the difference between said delayed filtered signal and a further-delayed filtered signal, and for outputting a multiplied signal which is an inverted further-delayed filtered signal multiplied by a first filter coefficient. At least said input signal, said delayed filtered signal, said multiplied signal, and said summed signal are employed to generate said filtered signal.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION

The present invention provides an IIR filter architecture that reduces the computational load compared to conventional implementations for over-sampled signals. It can be applied to any order of IIR filter.

Figure 1:
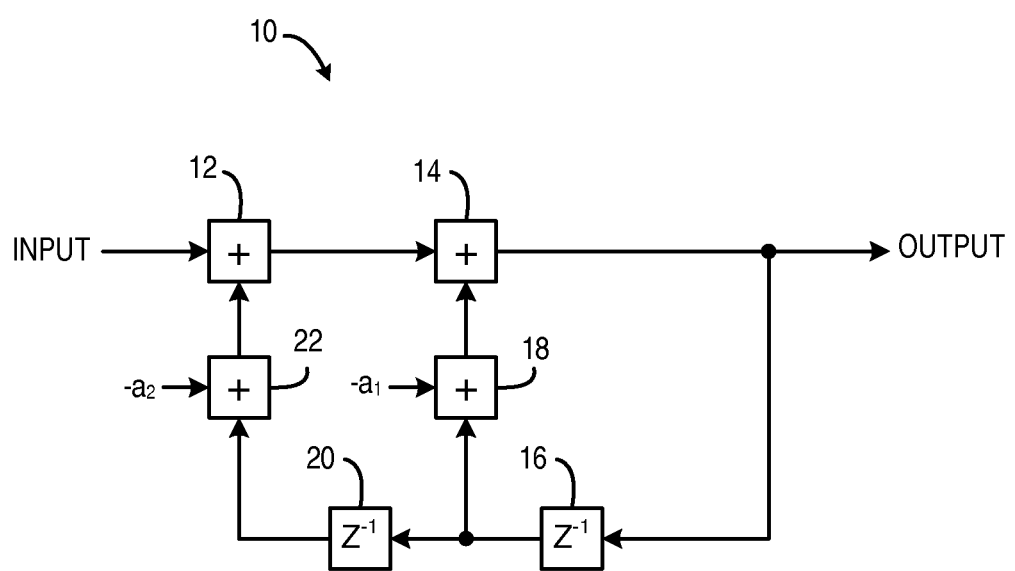
FIG. 1 shows the feedback part of a standard second-order IIR filter.

FIG. 1 shows the feedback part of a standard second-order IIR filter 10, which receives an input signal and outputs a filtered signal. The input is added to a first feedback signal in a first adding element 12, added to a second feedback signal in a second adding element 14, and then output from the filter as the filtered signal. The filtered signal is fed back through a first delay element 16, and multiplied by a first coefficient $a_1$ in a multiplying element 18 to generate the second feedback signal. The delayed signal output from the first delay element 16 is further output to a second delay element 20, and multiplied by a second coefficient $a_2$ in a second multiplier 22 to generate the first feedback signal.

The inventor observed that the values of the feedback coefficients $a_1$ and $a_2$ fall into certain narrow ranges for over-sampled filters. In particular, $a_1$ is always close to (but greater than) $-2$, and $a_2$ is close to (but less than) $+1$. Thus the values of $(a_1+2)$ and $(1-a_2)$ are positive and much less than one. Furthermore, it was noted that the first of these two values was only slightly larger than the second, so that the difference $(a_1+2)-(1-a_2)$, or $1+a_1+a_2$, was positive and small compared to either individual term. Thus these coefficients can be represented in a format that only requires these small differences to be used as coefficients, as follows:

$$H_0 = 2 + a_1$$

$$H_1 = 1 + a_1 + a_2$$

Figure 2:
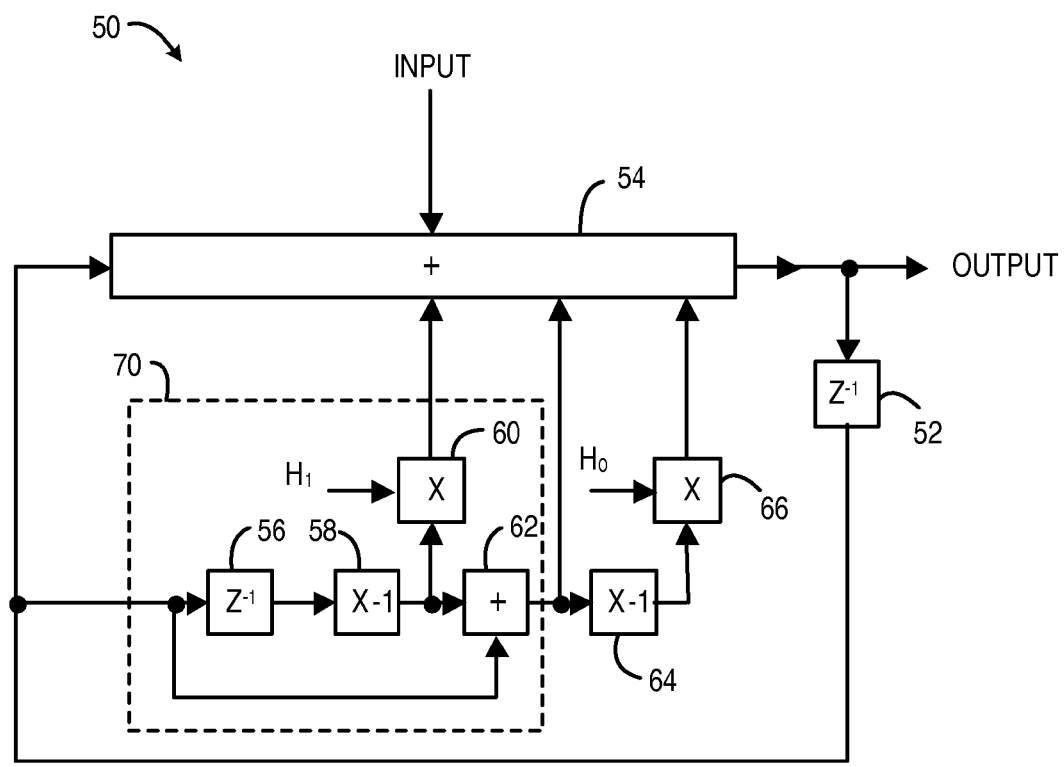
FIG. 2 shows a hardware implementation of a filter according to the present invention.

FIG. 2 shows a hardware implementation of a filter 50 which uses these coefficients.

The filter 50 receives an input signal, which is added to various fed back signals as follows, and outputs a filtered signal. The filtered signal is fed back through a delay element 52. The output from the delay element 52 is input to an adding element 54, where it is added to the input signal. The output from the delay element 52 is also input to a further delay element 56; the output from the delay element 56 is inverted in an inverter 58; the output from the inverter 58 is multiplied by $H_1$ in a multiplying element 60; and the output from the multiplying element 60 is input to the adding element 54. The output from the inverter 58 is further input to an adding element 62, where it is added to the output from the delay element 52; the output from the adding element 62 is also to the adder 54. The output from adding element 62 is further inverted in an inverter 64; the output from the inverter 64 is multiplied by $H_0$ in a multiplying element 66; and the output from the multiplying element 66 is also input to the adding element 54.

Thus, it can be seen that the filter 50 contains a functional group 70 of components, including the delay element 56, the inverter 58, the multiplying element 60 and the adding element 62. The functional group 70 receives an input signal (in this case the delayed filtered signal output from the delay element 52) and outputs an inverted signal multiplied by an H coefficient, and a summed signal.

The analysis of the z-domain transfer function of the filter 50 is as follows.

From the diagram, $$\text{out}=\text{in}+((1-z^{-1})(1-H_0)+1-H_1 z^{-1})z^{-1}\text{out}$$

Collecting together like terms, $$(1+(H_0-2)z^{-1}+(1-H_0+H_1)z^{-2})\times\text{out}=\text{in}$$

Substituting the expressions for H0 and H1, $$(1+a_1 z^{-1}+a_2 z^{-2})\times\text{out}=\text{in}$$

This is the same as the transfer function of standard second order IIR filter 10 of FIG. 1. Thus the architecture of FIG. 2 performs an identical function to that of FIG. 1, but has multiplication operations which require much less precision.

A second order Butterworth IIR low-pass filter was designed as an example. The coefficients required for the standard filter and for the invention are listed below for various ratios of sampling frequency to filter cut-off frequency.

The filter 100 comprises five cascaded functional groups 70A, 70B, 70C, 70D and 70E for multiplying by the coefficients $H_5$, $H_4$, $H_3$, $H_2$ and $H_1$, respectively. Thus, the filter 100 receives an input signal, which is added to various fed back signals as follows, and outputs a filtered signal. The filtered signal is fed back through a delay element 102. The output from the delay element 102 is input to an adding element 104, where it is added to the input signal. The output from the delay element 102 is also input to the first functional group 70A. The multiplied output of the first functional group 70A is output to a delay element 106; and the summed output of the first functional group 70A is input to the adding element 104, as well as the second function group 70B. The multiplied output of the second functional group 70B is output to an adding element 108, where it is added to the output from the delay element 106; the summed output of the second functional group 70B is input to the adding element 104, as well as the third function group 70C. The output from the adding element 108 is fed through a delay element 110 to an adding element 112. The multiplied output of the third functional group 70C is output to the adding element 112, where it is added to the output from the delay element 110; the summed output of the third functional group 70C is input to the adding element 104, as well as the fourth function group 70D. The output from the adding element 112 is fed through a delay element 114 to an adding element 116. The multiplied output of the fourth functional group 70D is output to the adding element 116, where it is added to the output from the delay

| Frequency ratio | Coefficient $a_1$ | Coefficient $a_2$ | Coefficient $H_0$ | Coefficient $H_1$ |
|---|---|---|---|---|
| 10 | −1.14298050253 | 0.412801598096 | 0.85701949747 | 0.269821095566 |
| 100 | −1.91119706742 | 0.914975834801 | 0.08880293257 | 0.003778767375 |
| 1000 | −1.99111429220 | 0.991153595868 | 0.00888570779 | 0.000039303667 |
| 10000 | −1.999111423470 | 0.999111818079 | 0.00088857652 | 0.0000003946088 |
| 100000 | −1.999911142341 | 0.999911146288 | 0.00008885765 | 0.0000000039476 |

It can be seen that the conventional filter (i.e. that which uses coefficients $a_0$ and $a_1$) requires increasingly higher precision coefficients as the frequency ratio is increased. In fact, for every increase by a factor of 10 in the frequency ratio, the coefficients need to be approximately 10 times more accurate. In contrast, each increase by a factor of 10 in the frequency ratio simply scales the $H_0$ and $H_1$ coefficients of the invention down by a factor of approximately 10. If these coefficients are implemented with a combination of a bit-shift and a multiply, the multiplier itself is unchanged by this scaling. It is therefore a second object of the invention to provide a filter which is easily scalable in the frequency domain by such means.

To further illustrate the invention, an example of a sixth-order filter 100 will be described. By cascading three second-order sections of the type shown in FIG. 1 (with different coefficients), the feedback part of the sixth-order filter is created. We define the coefficients of these second-order feedback sections as follows.

| Second-order section number | Coefficient $a_1$ | Coefficient $a_2$ |
|---|---|---|
| 1 | $a_{1A}$ | $a_{2A}$ |
| 2 | $a_{1B}$ | $a_{2B}$ |
| 3 | $a_{1C}$ | $a_{2C}$ |

Figure 3:
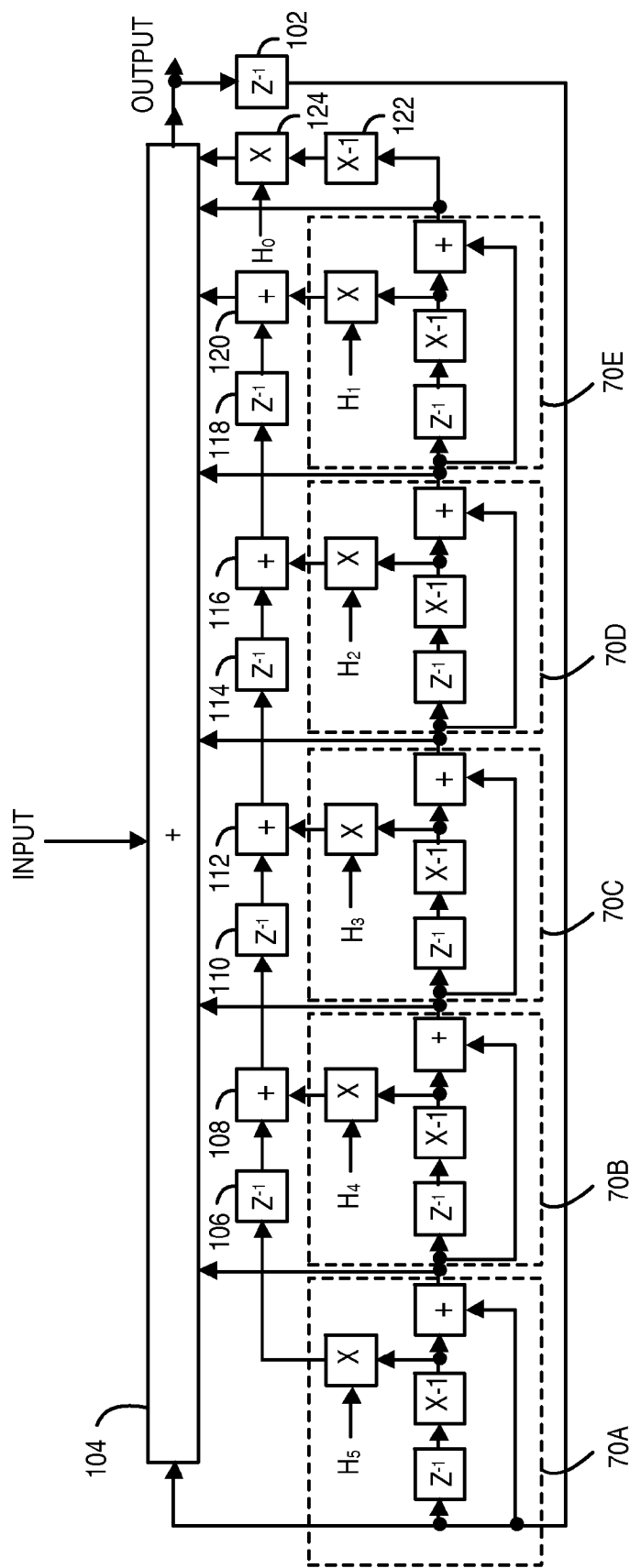
FIG. 3 shows the feedback part of a sixth-order IIR filter according to the present invention.

FIG. 3 shows the feedback part of a sixth-order IIR filter 100 according to the present invention.

element 114; the summed output of the fourth functional group 70D is input to the adding element 104, as well as the fifth function group 70E. The output from the adding element 116 is fed through a delay element 118 to an adding element 120. The multiplied output of the fifth functional group 70E is output to the adding element 120, where it is added to the output from the delay element 118; the output from the adding element 120 is input to the adding element 104. Further, the summed output of the fifth functional group 70E is input to the adding element 104, as well as an inverter 122. The output from the inverter 122 is fed to a multiplier 124, where it is multiplied by a coefficient $H_0$, and the output from the multiplier 124 is input to the adding element 104.

By following a similar mathematical process to that described above for a second-order filter, it is possible to derive the coefficients $H_0$ to $H_5$ as follows:

$$H_0 = A_A + A_B + A_C$$

$$H_1 = A_A A_B + A_A A_C + A_B A_C + B_A + B_B + B_C$$

$$H_2 = A_A A_B A_C + A_A (B_B + B_C) + A_B (B_A + B_C) + A_C (B_A + B_B)$$

$$H_3 = B_A B_B + B_A B_B + B_B B_C + A_A A_B B_C + A_A A_C B_B + A_B A_C B_A$$

$$H_4 = B_A B_B A_C + B_A B_C A_B + B_B B_C A_A$$

$$H_5 = B_A B_B B_C$$

where $$A_A = 2 + a_{1A}$$

$$B_A = 1 + a_{1A} + a_{2A}$$

$$A_B = 2 + a_{1B}$$

$$B_B = 1 + a_{1B} + a_{2B}$$

$$A_C = 2 + a_{1C}$$

$$B_C = 1 + a_{1C} + a_{2C}$$

Provided that the sampling rate is high compared to the pole and zero frequencies (i.e. the filter is over-sampled), as described above, the coefficients $H_0$ to $H_5$ can be represented by a bit shift and a coefficient with relatively few bits of precision. It can be proven that the architecture of FIG. 3 is mathematically equivalent to the original cascade of three second-order sections. The advantage of the invention is however clear: there are only six multiplies required, each of which requires a low-precision coefficient. For the same filter performance, the standard arrangement would require much higher multiplier precision.

It is easy to extend the invention to higher-order or lower-order filters. The H coefficient formulae sum terms of the same order in each case, where the terms such as $A_A$, $A_B$, and $A_C$ are regarded as first-order contributions and the terms such as $B_A$, $B_B$, and $B_C$ are regarded as second-order contributions. Thus, first-order terms are the $A_X$ coefficients, where the subscript X is A, B or C. Second-order terms are the $B_X$ coefficients and products of two different $A_X$ coefficients (i.e. $A_X \cdot A_Y$, where the subscripts X and Y are different). Third-order terms are products of three $A_X$ coefficients, or one $A_X$ and one $B_X$ coefficient, and so on. For the sixth-order filter 100 above, $H_0$ is the sum of the first-order terms, $H_1$ is the sum of the second-order terms, $H_2$ is the sum of third-order terms, and so on, up to $H_5$, which is the sum of sixth-order terms, of which there is only one.

Figure 4:
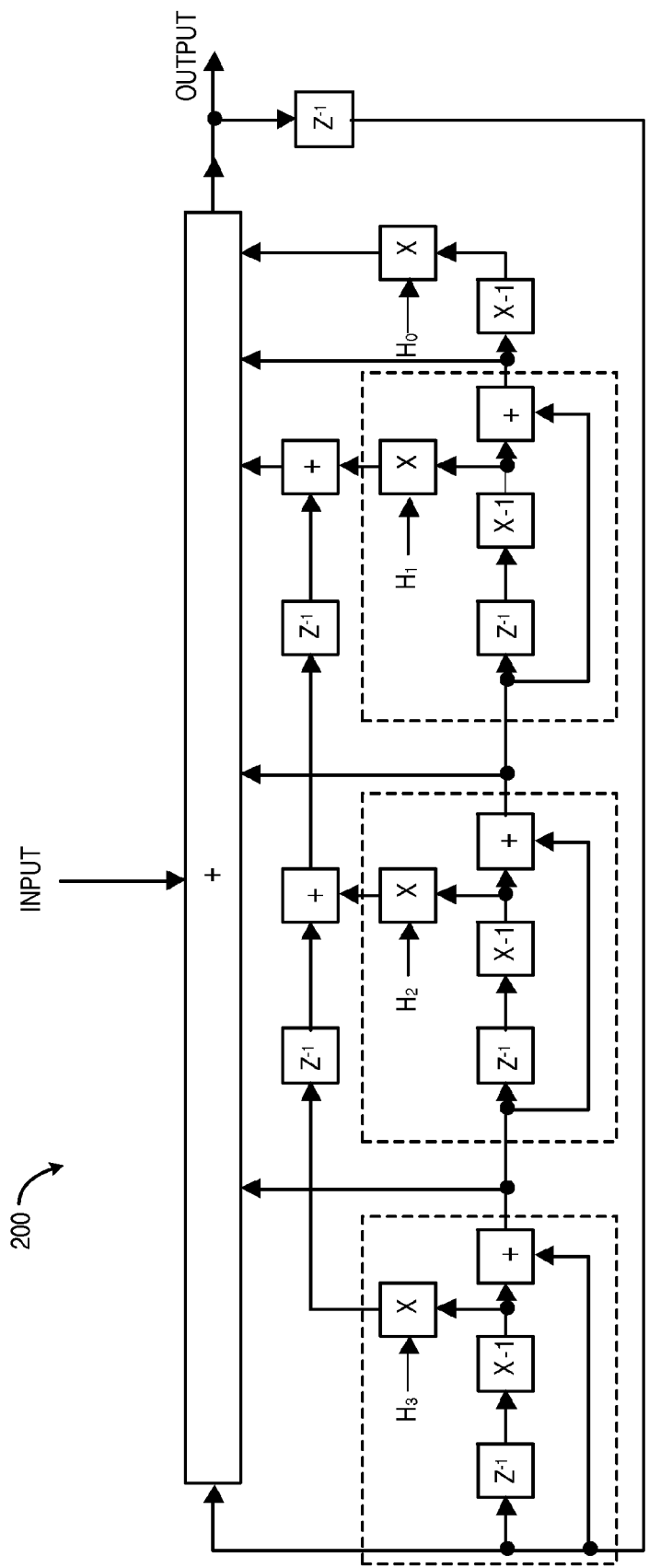
FIG. 4 shows the feedback part of a fourth-order IIR filter according to the present invention.

It is also easy to see how the architecture extends to other filter orders. As a further example, a fourth-order filter 200 is shown in FIG. 4, and requires coefficients calculated according to the following formulae:

$$H_0 = A_A + A_B$$

$$H_1 = A_A A_B + B_A + B_B$$

$$H_2 = A_A B_B + A_B B_A$$

$$H_3 = B_A B_B$$

where the $A_x$ and $B_x$ values are as defined earlier.

To demonstrate the advantages of the invention, a real example will be used. A fourth-order Butterworth low-pass filter with a cut-off frequency of 200 Hz and a sample rate of 3.072 MHz was designed using a standard filter design tool. The coefficients were as follows.

$$a_{1A} = -1.999239168990805$$

$$a_{2A} = 0.9992393400955952$$

$$a_{1B} = -1.999691901686791$$

$$a_{2B} = 0.9996920674391542$$

Note that the coefficients would require 10 bits in order to represent the 0.999 part, and depending on the accuracy requirements, possibly a further 16 bits to represent the coefficient in sufficient detail—a total of 26 bits.

Long data word lengths are usual in a conventional oversampled filter, and the present invention does not avoid this. In both cases, therefore, as much as a 64-bit data word length may be required throughout the filter. In this case, the multiplier requirement for a conventional filter is therefore 64×26 bit multiplies.

The values of the H coefficients using the formulae presented earlier are $$H_0 = 0.547291813070848 \times 2^{-9}$$

$$H_1 = 0.599 \times 2^{-20}$$

$$H_2 = 0.768054549 \times 2^{-32}$$

$$H_3 = 0.99786479768 \times 2^{-45}$$

Each coefficient requires a different bit-shift to implement the scaling power of 2. It has been found by simulation that the normalised H coefficients can be implemented with 8 or fewer bits without significant loss of filter accuracy. Because of the differing bit shift, the data word length for the multipliers is also reduced. $H_3$, for example, only requires a data word length of 64-45, i.e. 19 bits. It therefore requires a 19×8 bit multiplier, a considerable saving on the conventional 64×26 multiply.

It can be seen that the magnitude of each H coefficient is approximately 212 times smaller than the previous $a_X$ coefficient in this example; thus each successive bit-shift is 12 bits higher than the previous one. This is a result of the oversampling ratio: the higher the sampling frequency relative to the filter poles, the larger the ratio between H coefficients. This allows a programmable or variable filter to be implemented with a limited or even fixed set of bit-shifts; thus expensive barrel-shifters are not required. Knowledge of these bit-shifts also allows reduced-length adders to be used in some parts of the architecture.

Figure 5:
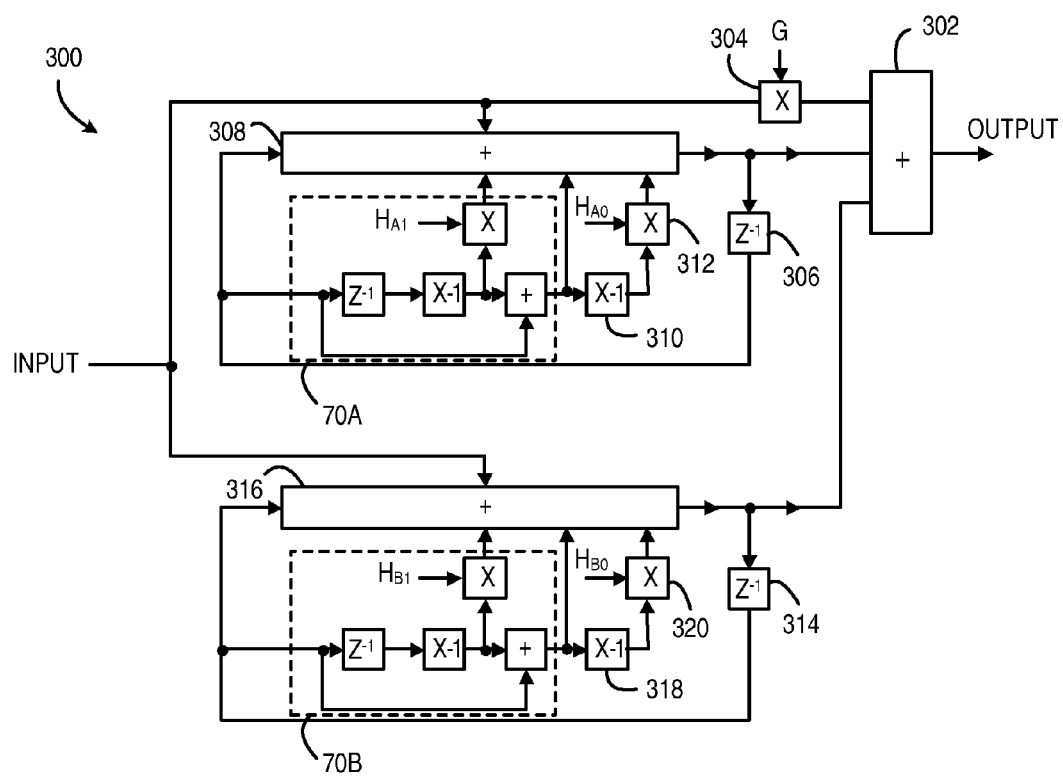
FIG. 5 shows the feedback part of a fourth-order IIR filter arranged in a parallel format, according to the present invention.

An alternative to cascading second-order sections as described above is to arrange second-order sections in parallel, with their inputs connected to a common point and their outputs summed to form the filter output. An example of a 4th order filter 300 arranged in this format is shown in FIG. 5.

The filter 300 includes substantially similar first and second second-order units, for multiplying by coefficients $H_{A1}$ and $H_{A0}$, and $H_{B1}$ and $H_{B0}$, respectively. The first unit receives an input signal and outputs a first intermediate filtered signal. The second unit also receives the input signal and generates a second intermediate filtered signal. The first and second intermediate filtered signals are summed in an adding element 302, to generate the overall filtered output signal. Optionally, an additional gain term G may be required as shown to implement some filters, that is, the input signal may also be input to the adding element 302 via a multiplying element 304, for multiplying the input signal by a gain term G.

In the first second-order unit, the first intermediate filtered signal is fed back through a delay element 306. The output from the delay element 306 is input to an adding element 308, where it is added to the input signal. The output from the delay element 306 is also input to a first functional group 70A'. The $H_{A1}$-multiplied output of the first functional group 70A' is output to the adding element 308; the summed output of the first functional group 70A' is output to the adding element 308 and an inverter 310. The output from the inverter 310 is input to a multiplying element 312, which multiplies it by the coefficient $H_{A0}$. The multiplied output from the multiplying element 312 is further input to the adding element 308.

In the second second-order unit, the second intermediate filtered signal is fed back through a delay element 314. The output from the delay element 314 is input to an adding element 316, where it is added to the input signal. The output from the delay element 314 is also input to a second functional group 70B'. The $H_{B1}$-multiplied output of the second functional group 70B' is output to the adding element 316; the summed output of the second functional group 70B' is output to the adding element 316 and an inverter 318. The output from the inverter 318 is input to a multiplying element 320, which multiplies it by the coefficient $H_{B0}$. The multiplied output from the multiplying element 320 is further input to the adding element 316.

The outputs from the adding elements 306, 318 are then input to the adding element 302 as the first and second intermediate filtered signals, respectively.

The fact that the inputs of all the second-order sections are connected together has useful benefits that are described below.

The feed-forward part of the IIR filter will now be discussed.

There are several ways in which the feed-forward part of the filter may be implemented without loss of applicability of the feedback part of the present invention described above. These include the standard methods of direct implementation and a cascade of second-order sections, referred to earlier.

In addition, there are unconventional techniques which are particularly well suited to over-sampled systems. In many highly over-sampled systems, the data width can be quite low, maybe only one bit. This is possible without loss of signal quality because higher sampling rates can be traded off against word length. The application of an IIR filter to such signals favours the implementation of the feed-forward part of the filter in a single stage, instead of splitting it into cascaded second-order sections, and then this single stage can be further simplified, as explained below. These techniques are also directly applicable to the parallel arrangement of second-order sections.

Figure 6A:
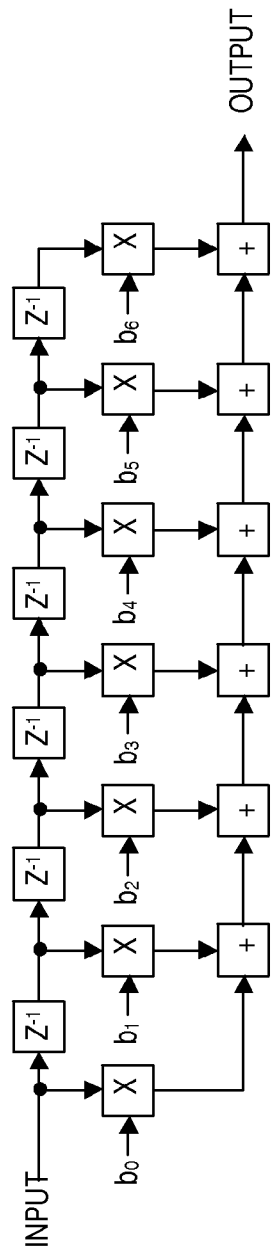
FIG. 6a shows a direct implementation of the feed-forward part of a filter according to the present invention.
Figure 6B:
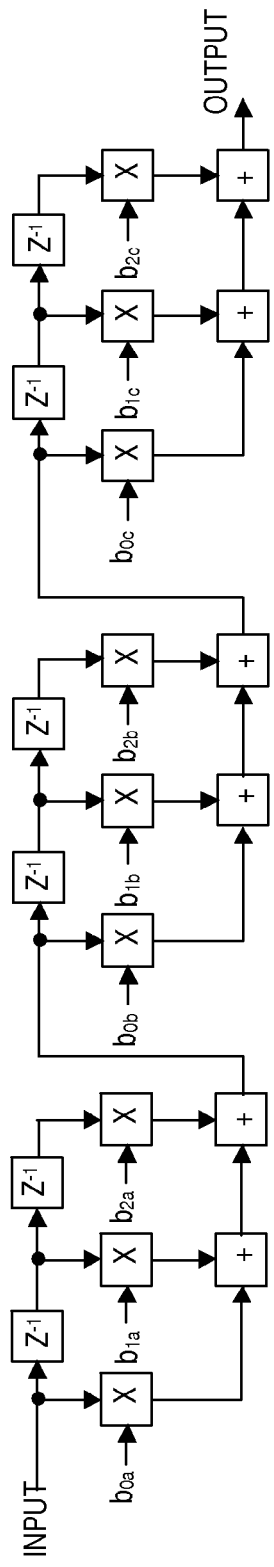
FIG. 6b shows the filter described in FIG. 6a split into three cascaded second-order sections.

FIG. 6a shows a direct implementation of the feed-forward part, and FIG. 6b shows it split into three cascaded second-order sections. All the multipliers of FIG. 6a receive the data input, which has only a few bits, or a single bit. The multipliers therefore require relatively few hardware or software resources to implement. In contrast, in FIG. 6b, only the first stage has this advantage: the other stages have a long word-length input from the previous stage, and therefore require much larger multiplications.

Figure 7:
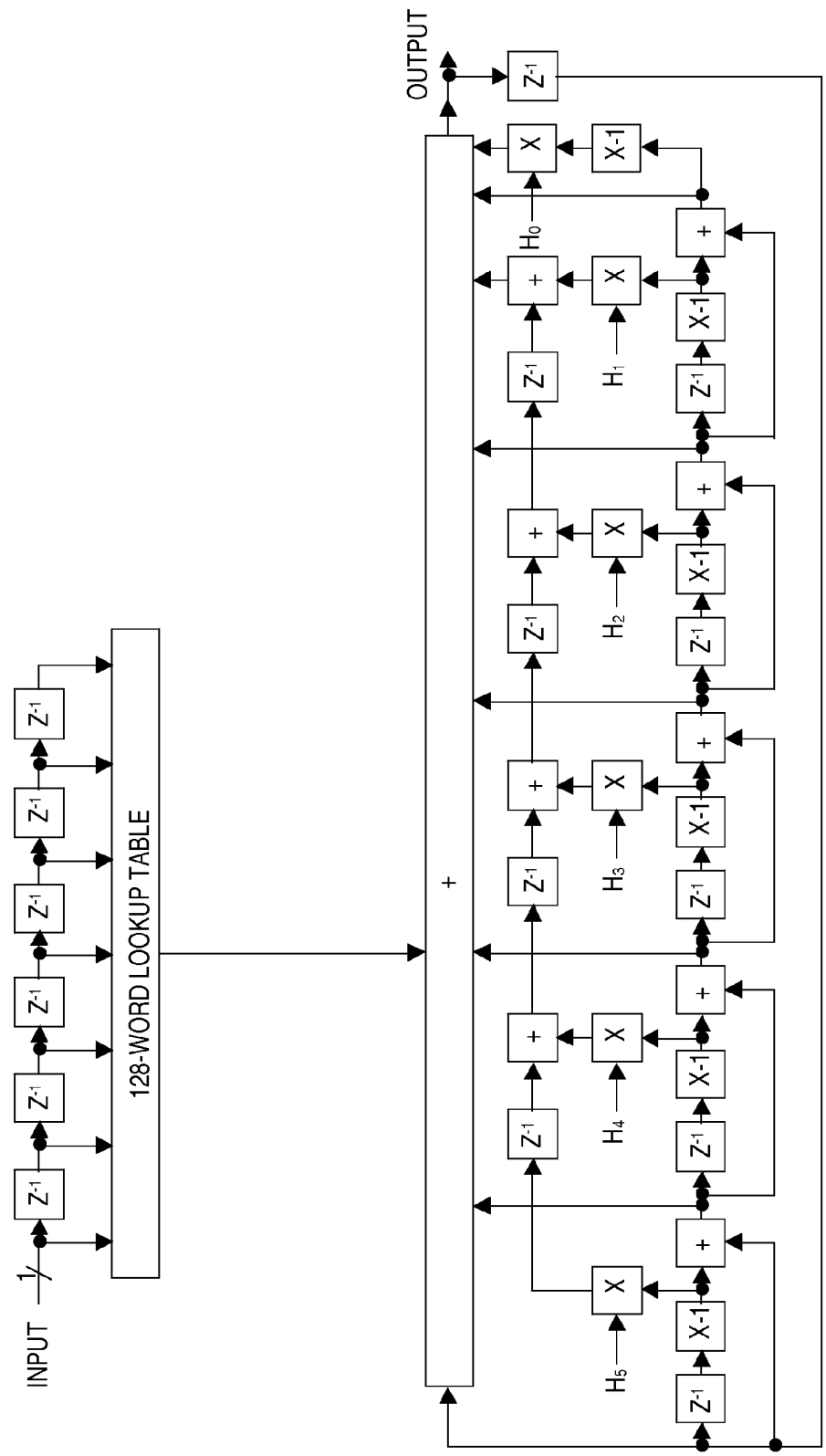
FIG. 7 shows a sixth-order filter comprising a look-up table according to the present invention.

The method of FIG. 6a is therefore preferred for these applications. The multipliers can be implemented by a hardware ROM or RAM, or software look-up table, as for example shown in FIG. 7. In the parallel arrangement of second-order sections, further savings can be made by sharing the chain of input delay elements between all the second-order sections.

Figure 8:
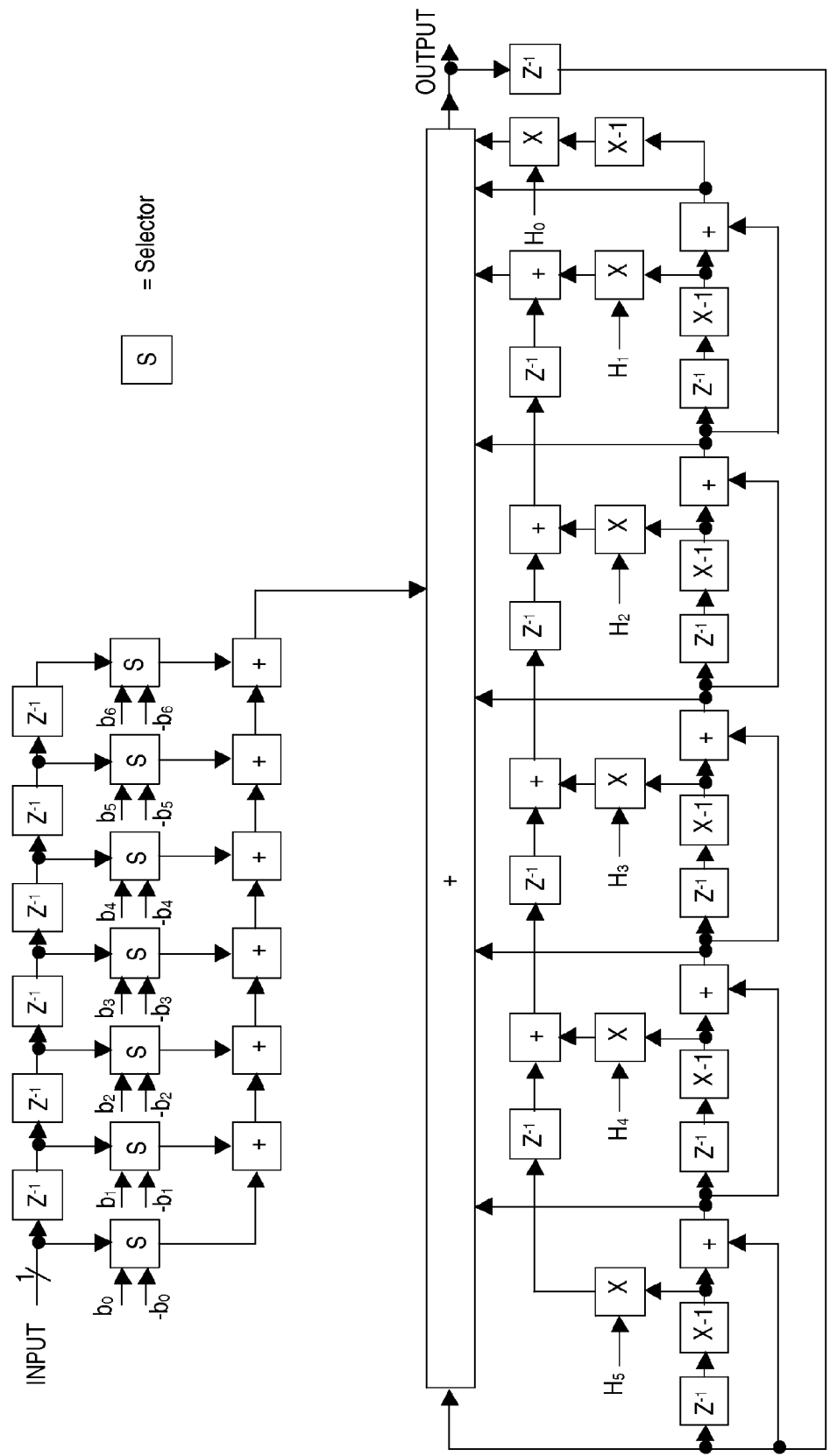
FIG. 8 shows another sixth-order IIR filter according to the present invention.
Figure 9:
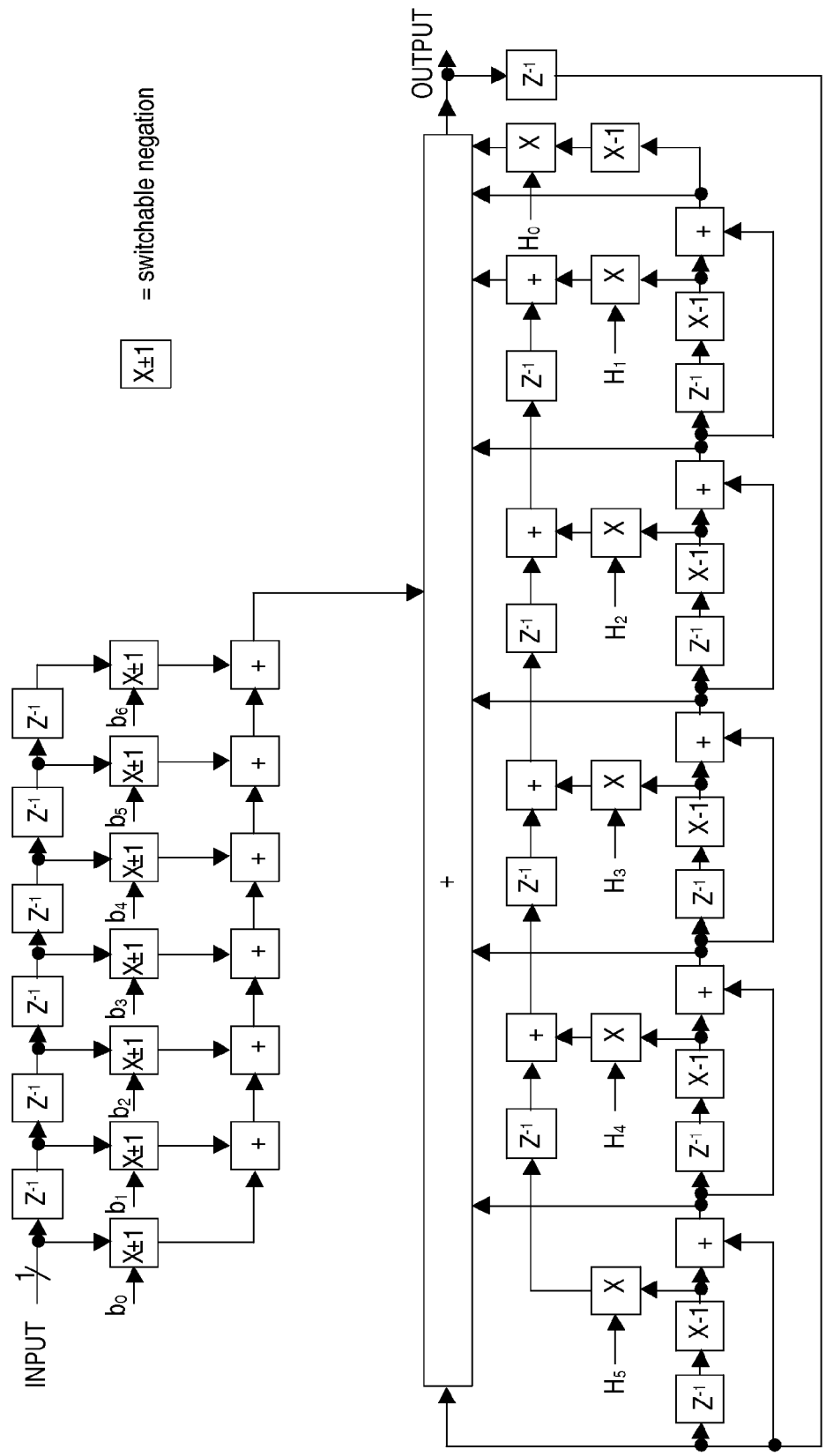
FIG. 9 shows a further sixth-order IIR filter according to the present invention.

In the case of a single-bit input, the multipliers can be replaced by selectors (multiplexers) that select either the coefficient or its negated version, as shown in FIG. 8, or by switchable negation stages, as shown in FIG. 9, thus avoiding the use of any multipliers.

It will be clear to those skilled in the art that the implementation may take one of several hardware or software forms, and the intention of the invention is to cover all these different forms.

The skilled person will recognise that the above-described apparatus and methods may be embodied as processor control code, for example on a carrier medium such as a disk, CD- or DVD-ROM, programmed memory such as read only memory (firmware), or on a data carrier such as an optical or electrical signal carrier. For many applications, embodiments of the invention will be implemented on a DSP (digital signal processor), ASIC (application specific integrated circuit) or FPGA (field programmable gate array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (very high speed integrated circuit hardware description language). As the skilled person will appreciate, the code may be distributed between a plurality of coupled components in communication with one another. Where appropriate, the embodiments may also be implemented using code running on a field-(re-)programmable analogue array or similar device in order to configure analogue/digital hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An infinite impulse response (IIR) filter for receiving an input signal and outputting a filtered signal, said IIR filter comprising:
    feedback circuitry for feeding back said filtered signal, said feedback circuitry comprising:
        a first delay element for delaying said filtered signal; and
        a sub-unit, for receiving said delayed filtered signal, for outputting a summed signal which is the difference between said delayed filtered signal and a further-delayed filtered signal generated by a second delay element, and for outputting a multiplied signal which is an inverted further-delayed filtered signal multiplied by a first filter coefficient;
    wherein at least said input signal, said delayed filtered signal, said multiplied signal, and said summed signal are employed to generate said filtered signal.

2. An IIR filter as claimed in claim 1, wherein said feedback circuitry further comprises a second sub-unit, said second sub-unit being substantially similar to said first sub-unit.

3. An IIR filter as claimed in claim 2, wherein said first sub-unit and said second sub-unit are coupled in series with each other.

4. An IIR filter as claimed in claim 2, wherein said first sub-unit and said second sub-unit are coupled in parallel with each other.

5. An infinite impulse response (IIR) filter for receiving an input signal and outputting a filtered signal, said IIR filter comprising:
    feedback circuitry for feeding back said filtered signal, said feedback circuitry comprising:
        a first delay element for delaying said filtered signal; and
        a sub-unit, comprising:
            a second delay element for delaying said delayed filtered signal, generating a further-delayed filtered signal;
            an inverter for inverting said further-delayed filtered signal;
            a first adder for adding said delayed filtered signal and said inverted further-delayed filtered signal and generating a summed signal; and
            a multiplier for multiplying said inverted further-delayed filtered signal by a first filter coefficient;

wherein at least said input signal, said delayed filtered signal, said inverted further-delayed filtered signal multiplied by said first filter coefficient, and said summed signal are employed to generate said filtered signal.

6. An IIR filter as claimed in claim 5, wherein said feedback circuitry further comprises a second sub-unit, said second sub-unit being substantially similar to said first sub-unit.

7. An IIR filter as claimed in claim 6, wherein said first sub-unit and said second sub-unit are coupled in series with each other.

8. An IIR filter as claimed in claim 6, wherein said first sub-unit and said second sub-unit are coupled in parallel with each other.

* * * * *

UNITED STATES PATENT AND TRADEMARK OFFICE
CERTIFICATE OF CORRECTION

PATENT NO. : 8,645,444 B2  Page 1 of 1
APPLICATION NO. : 12/745726
DATED : February 4, 2014
INVENTOR(S) : Clemow et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 627 days.

Signed and Sealed this

Twenty-ninth Day of September, 2015

Michelle K. Lee
*Director of the United States Patent and Trademark Office*